United States Patent
Horioka et al.

(10) Patent No.: US 9,250,014 B2
(45) Date of Patent: Feb. 2, 2016

(54) VACUUM STORAGE METHOD AND DEVICE FOR CRYSTALLINE MATERIAL

(75) Inventors: Yukichi Horioka, Noda (JP); Jiro Kajiwara, Tokyo (JP); Hirotsugu Sanada, Tokyo (JP)

(73) Assignee: MITSUBISHI MATERIALS TECHNO CORPORATION, Tokyo (JP)

( * ) Notice: Subject to any disclaimer, the term of this patent is extended or adjusted under 35 U.S.C. 154(b) by 105 days.

(21) Appl. No.: 14/240,844

(22) PCT Filed: Aug. 25, 2011

(86) PCT No.: PCT/JP2011/069233
§ 371 (c)(1),
(2), (4) Date: Mar. 13, 2014

(87) PCT Pub. No.: WO2013/027299
PCT Pub. Date: Feb. 28, 2013

(65) Prior Publication Data
US 2014/0223763 A1   Aug. 14, 2014

(51) Int. Cl.
*F26B 13/10* (2006.01)
*F26B 3/18* (2006.01)
(Continued)

(52) U.S. Cl.
CPC . *F26B 3/18* (2013.01); *C30B 11/00* (2013.01); *C30B 11/002* (2013.01); *C30B 15/00* (2013.01); *C30B 15/10* (2013.01); *B22F 3/00* (2013.01); *C30B 29/06* (2013.01); *C30B 29/42* (2013.01)

(58) Field of Classification Search
CPC ......... F26B 11/00; F26B 13/00; A47L 15/00; A47L 15/0042; C03B 11/00
USPC .................. 34/263, 381, 412, 78; 29/592; 101/389.1, 483
See application file for complete search history.

(56) References Cited

U.S. PATENT DOCUMENTS 4,618,592 A * 10/1986 Kuramoto ........... C01B 21/0726
                                                              264/676
6,920,704 B1 * 7/2005 Silverbrook ........... B41J 11/002
                                                              101/483
(Continued)

FOREIGN PATENT DOCUMENTS

JP          55-77149      *  6/1980
JP          63-285183 A     11/1988
(Continued)

OTHER PUBLICATIONS

European Search Report, dated Feb. 10, 2015, issued in Application No. 11871102.7, based on International Patent Application No. PCT/JP2011/069233.

(Continued)

*Primary Examiner* — Stephen M Gravini
(74) *Attorney, Agent, or Firm* — Pearne & Gordon LLP

(57) ABSTRACT

The present invention provides a method for storing a raw material inside a mold or a crucible, comprising the steps of: closing an opening of the mold filled with the raw material of a sintered metal or an opening of the crucible filled with the raw material for encouraging growth of a crystal for a semiconductor of a gallium arsenide crystal and a silicon single crystal or a polycrystalline silicon by a cap provided with a supply pipe and a vacuum evacuation pipe; vacuuming the inside the mold or crucible to a high vacuum state of $10^{-4}$ torr or less via the vacuum evacuation pipe; drying by heating the raw material in the mold or crucible filled with a heated inert gas in the range of 50 C. to 200 C. via the supply pipe; and storing the raw material in the mold or the crucible covered with the cap.

12 Claims, 2 Drawing Sheets

(51) Int. Cl.
*C30B 11/00* (2006.01)
*C30B 15/00* (2006.01)
*C30B 15/10* (2006.01)
C30B 29/06 (2006.01)
C30B 29/42 (2006.01)
B22F 3/00 (2006.01)

(56) References Cited

U.S. PATENT DOCUMENTS

| | | | | |
|---|---|---|---|---|
| 6,944,970 | B2* | 9/2005 | Silverbrook | F26B 13/102 101/389.1 |
| 7,201,572 | B2* | 4/2007 | Wood | C04B 35/565 264/109 |
| 7,392,599 | B2* | 7/2008 | Ishihara | H01L 21/67028 34/381 |
| 7,654,010 | B2* | 2/2010 | Moriya | H01L 21/67017 118/65 |
| 8,393,091 | B2* | 3/2013 | Kawamoto | H01L 21/02057 134/21 |
| 8,904,667 | B2* | 12/2014 | Sauerbeck | A47L 15/0042 34/263 |
| 2003/0021015 | A1* | 1/2003 | Maier | C03B 19/1453 359/350 |
| 2003/0183306 | A1* | 10/2003 | Hehmann | C23C 14/14 148/404 |
| 2004/0173948 | A1* | 9/2004 | Pandelisev | B29C 43/006 264/500 |
| 2005/0279276 | A1 | 12/2005 | Holder | |
| 2009/0018668 | A1* | 1/2009 | Galbraith | B01J 20/3441 623/23.65 |
| 2013/0207538 | A1* | 8/2013 | Hirosaki | C09K 11/0883 313/504 |
| 2014/0109386 | A1* | 4/2014 | Matthews | B22D 18/06 29/592 |
| 2014/0178513 | A1* | 6/2014 | Matthews | B29C 47/54 425/6 |
| 2014/0223763 | A1* | 8/2014 | Horioka | C30B 11/00 34/412 |
| 2014/0287583 | A1* | 9/2014 | Liu | H01B 1/22 438/660 |

FOREIGN PATENT DOCUMENTS

| | | |
|---|---|---|
| JP | 04-218601 A | 8/1992 |
| JP | 04-236701 A | 8/1992 |
| JP | 06-041615 A | 2/1994 |
| JP | 08-041506 A | 2/1996 |
| JP | 10-110223 A | 4/1998 |
| JP | 2003-089825 A | 3/2003 |
| JP | 2008207984 A | 9/2008 |
| JP | 2009-167073 A | 7/2009 |
| JP | 2011105551 A | 6/2011 |
| JP | 2011-178646 A | 9/2011 |
| KR | 10-1999-0080464 B1 | 3/2000 |

OTHER PUBLICATIONS

Translation of an Office Action, dated Jun. 28, 2011, issued in Japanese Patent Application No. 2010-059869.
Office action for Korean Application No. 10-2014-7001849 dated Mar. 17, 2015 (English translation included).
International Search Report for PCT/JP2011/069233; Feb. 28, 2013.
Office Action issued in corresponding Chinese Patent Application No. 201180072961.8 dated Oct. 9, 2015.
Office Action issued in corresponding Korean Patent Application No. 10-2014-7001849 dated Sep. 24, 2015.

* cited by examiner

VACUUM STORAGE METHOD AND DEVICE FOR CRYSTALLINE MATERIAL

BACKGROUND OF THE INVENTION

1. Field of the Invention

The present invention relates to a method for storing and transferring a raw material for a dissolving or sintered metal.

2. Description of the Related Art

A raw material of a sintered metal, and a raw material for growing a gallium arsenide crystal, a silicon single crystal or a polycrystalline silicon for a semiconductor have been stored in a plastic film for growing. When used, the plastic film is opened and the raw material is put into a mold in process.

Especially during a crystal production process, a quartz crucible has been stuffed with the raw material at room temperature, and has been stored or put in a furnace.

For example, JP 2009-127085A discloses a surface treatment method for obtaining a dry material of metal fine particles storable for a long time, and a method for storing the dry material. The method for obtaining the dry material of the metal fine particles re-dispersable in water comprises adding a flocculant to water in which the metal fine particles adsorbed with a surfactant and a lipid are dispersed, making the metal fine particles aggregated and settled out, and drying in a vacuum the aggregation of the settled metal fine particles.

However, for a raw crystal for growing a highly purified semiconductor crystal, it is necessary to highly remove impurities from the raw crystal. When the raw crystal is placed in the air, a slight amount of substances such as air or water is adsorbed on the surface. Therefore, most of the adsorbed substances should be removed at the initial stage because the substances affect improvements of quality of products and durability of parts in a furnace.

As described above, the related art, for example, JP 2009-127085A discloses a method for obtaining a dry material re-dispersable in water. However, in order to grow a sintered metal material or a semiconductor crystal to obtain a polycrystal, the raw material requires high purity. In addition, a slight amount of water adsorbed on a surface of the raw material may cause a deterioration of parts in a furnace in the following step of growing a crystal. Moreover, carbon reacted with water may be incorporated into the grown crystal.

Patent Literature 1: JP 2009-127085A

SUMMARY OF THE INVENTION

Objects of the present invention are to prevent a deterioration of parts made of carbon in an area in a furnace called as a hot zone during a growth of a raw material of a sintered metal or a single crystal for a semiconductor by CZ method, and to reduce a concentration of carbon and improve a rate of a polymerized single crystal during growth of a crystal. In addition, objects of the present invention are to prevent considerable consumption of parts made of carbon stem from a water-adsorbed sintered metal material or a raw crystal for a semiconductor in the furnace caused by opening the furnace, thereby solving deterioration of the furnace, and to prevent incorporation of SiC produced from a reaction between a fused silicon and carbon brought from a crystal thereby solving generation of a dislocation.

For achieving the objects of the present invention, the present invention provides a method or steps for growing a single crystal. In the method, water on the sintered metal material, water on the mold capable of keeping high vacuum, water adsorbed on the raw crystal filled in the crucible, or water on the crucible for growing a single crystal for a semiconductor are dried and removed. Alternatively, a residual adsorbed material is actively reacted in a chemical manner, changed to harmless material, and evacuated in a vacuum. As a result, the present invention may enhance the quality of sintered metal products and may prevent generating dislocation in a silicon single crystal, thereby obtaining in a high yield ratio a high-quality crystal with low-carbon concentration.

A method for storing a raw material inside a mold or a crucible, comprises the steps of: closing an opening of the mold filled with the raw material of a sintered metal or an opening of the crucible filled with the raw material for encouraging growth of a crystal for a semiconductor of a gallium arsenide crystal and a silicon single crystal or a polycrystalline silicon by a cap provided with a supply pipe and a vacuum evacuation pipe; vacuuming the inside of the mold or crucible to a high-vacuum state of $10^{-4}$ torr or less via the vacuum evacuation pipe; drying by heating the raw material in the mold or crucible filled with a heated inert gas in the range of 50 C. to 200 C. via the supply pipe; and storing the raw material in the mold or the crucible covered with the cap.

The sintered metal material is formed as a part by heating a mixture of a variety of metal powders to allow them to adhere each other under high temperature. In this case, moisture in the air, air components or other gases may be mixed in the metal powders, which may cause quality loss of the sintered metal material. Therefore, drying or degassing contributes to producing a product of a high-quality sintered metal material. With reference to the vertical gradient freeze (VGF) method for growing a crystal of silicon or gallium arsenide, it is important to improve the quality of the crystal by drying, degassing, and removing water in a step of supplying a raw material. Further, in growing a single crystal, drying, degassing, and removing water effect not only the improvement of the quality of the crystal but also the improvement of durability of parts in a furnace.

Even if water is removed under vacuum, a surface of the raw material readsorbs water in the air when the raw material is subjected to the air even for a short time. However, if the initial degree of vacuum inside the mold or crucible is $10^{-4}$ torr or less, the heated inert gas is in the range of 50 C. to 200 C., and the raw material crystal or the sintered metal material is heated by the inert gas, the re-adsorbance of water may be prevented, whereby a high-quality crystal product and sintered material product are obtained.

In the step of vacuuming, after roughly vacuuming, vacuuming may be performed to a high vacuum state of $10^{-4}$ or less using a vacuum evacuation device for keeping a high vacuum state, such as a cryopump, a diffusion pump, or a molecular pump. After roughly vacuuming using a vacuum pump such as a rotary pump, vacuuming with a cryopump, a diffusion pump, or a molecular pump may be performed to a high vacuum state of $10^{-4}$ or less, thereby making the pressure inside the mold or crucible highly-vacuumed state quickly. The quick vacuuming is effective for removing residual gases, in particular water.

After heating the raw material by the heated inert gas, the heated inert gas is evacuated. Then, the pressure inside the mold or crucible returns to a high vacuum state of $10^{-4}$ torr or less. After re-vacuuming, the heated inert gas may be refilled in the mold or crucible. Namely, a repeat of gas replacement and vacuum may further improve the atmosphere, heat the raw material, and decrease the adsorbed gases and water.

The mold closed with the cap in which the raw material is stored may be transferred to a sintering place. The crucible closed with the cap in which the raw material is stored may be transferred to a crystal growing place.

The mold or crucible covered with the cap may be heated from the outside of the mold or crucible to keep the raw material heated. That is, the raw material in the mold or crucible is not only heated by the heated gas but also heated from the outside of the mold or crucible. Therefore, the raw material may be heated quickly.

Mono-silane gas may be mixed in the heated inert gas. The mono-silane gas diluted by the heated inert gas is effective for evacuation of residual water and adsorbed gases. Especially, water inside the furnace made of porous material is removed in excellent way when the inside of the furnace is heated thereafter.

A storing device according to the present invention comprises a mold or crucible, and a cap, wherein an opening of the mold filled with the raw material of a sintered metal or an opening of the crucible filled with the raw material for encouraging growth of a crystal for a semiconductor of a gallium arsenide crystal and a silicon single crystal or a polycrystalline silicon is covered by the cap provided with a supply pipe and a vacuum evacuation pipe; and wherein the inside of the mold or crucible is vacuumed and filled with a heated inert gas in the range of 50 C. to 200 C. via the supply pipe such that the raw material is heated and dried. The storing device may comprise a transfer means transferring the mold covered with the cap in which the raw material is stored to a sintering place, or transferring the crucible covered with the cap in which the raw material is stored to a place to grow a crystal.

Regarding the transfers to the sintering place and the place to grow a crystal, a transferring bracket is secured to a transferring arm-attachable part on the cap covering the mold or crucible under reduced pressure or vacuum state. The mold or crucible is transferred by moving the transferring bracket to the next step, namely the sintering step or the crystal growing step.

The inert gas including mono silane gas or silane gas in the range of 0.01 to 3% may be supplied to the furnace when the heated inert gas is supplied to the raw material in the mold or crucible sealed. When a slight amount of the mono silane gas or silane gas is further heated in the next step, the following chemical reaction (1) or (2) will occur.

$$SiH_4 + 2H_2O = SiO_2 + 4H_2 \quad (1)$$

$$SiClH_3 + 2H_2O = SiO_2 + HCl + 3H_2 \quad (2)$$

Adsorbed water on the sintered metal, parts in the furnace, or the raw material for silicon is converted to other materials by the reaction (1) or (2), then the water is discharged outside the furnace effectively.

According to the present invention, the invention may dry with certainty the sintered metal material or the raw crystal material for a semiconductor filled in the mold or crucible in a vacuum, and the materials may be transferred to a sintering furnace or a crystal growing furnace.

According to the present invention, the sintered metal material or the raw crystal material for a semiconductor may be dried with certainty in vacuum. Because the materials are heated, if the material is subjected to the air shortly, water in the air may not be adsorbed on the material. In addition, because the material can be transferred to a sintering furnace or a crystal growing furnace, in a step of sintering the material or growing the crystal after transferring the material, the degree of vacuum may be improved and a high vacuum state may be achieved in a short period of time. Further, because water as an adsorbed material is removed in a reliable manner, a high-quality sintered alloy may be obtained. Furthermore, because a dislocation in a single crystal and polycrystallization during the crystal growth is prevented in a reliable manner, a yield of the crystal may be increased as well as the durability of parts in the furnace may be improved. Moreover, during the crystal growth, impurities and a defective core may be decreased.

Because a residual air or water in the furnace is not brought into the raw material, in a step of heating after vacuuming, a production of a hydrocarbon compound may be inhibited. Further, because the hydrocarbon compound that is easily reactable with silicon is removed before a step of dissolving silicon, an impurity such as a carbide or oxide of silicon, which prevents growing the single crystal, may not be produced, thereby increasing a yield of the crystal. Furthermore, in the conventional process, parts made of carbon in a furnace are deformed by hydrocarbonation stem from water in the parts but the present invention may prevent deforming the parts made of carbon.

In addition, because the present invention decreases an amount of carbon incorporated into a crystal during the growth, in the following wafer process, generation of oxygen stem from carbon during a heat treatment may be decreased. In the meantime, a crystal defect stem from carbon may be decreased.

Moreover, according to the present invention, stability of quality is realized due to less degradation of the parts in the furnace, which reduces the aging variation of the conventional process conditions.

DESCRIPTION OF THE PREFERRED

One of the best embodiments of the present invention is described below.

Figure 1:
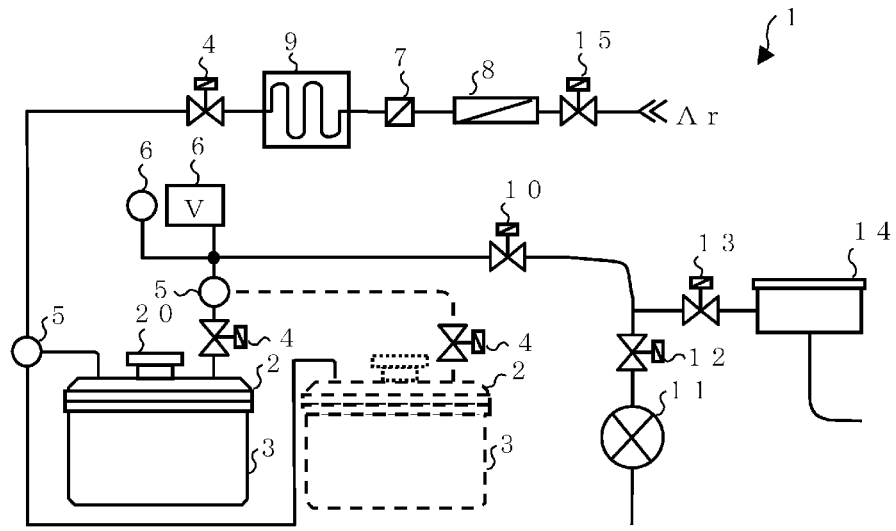
FIG. 1 is a schematic view of an embodiment of a system comprising the steps of heating a mold or crucible, drying in vacuum, and transferring the mold or crucible according to the present invention.
Figure 2:
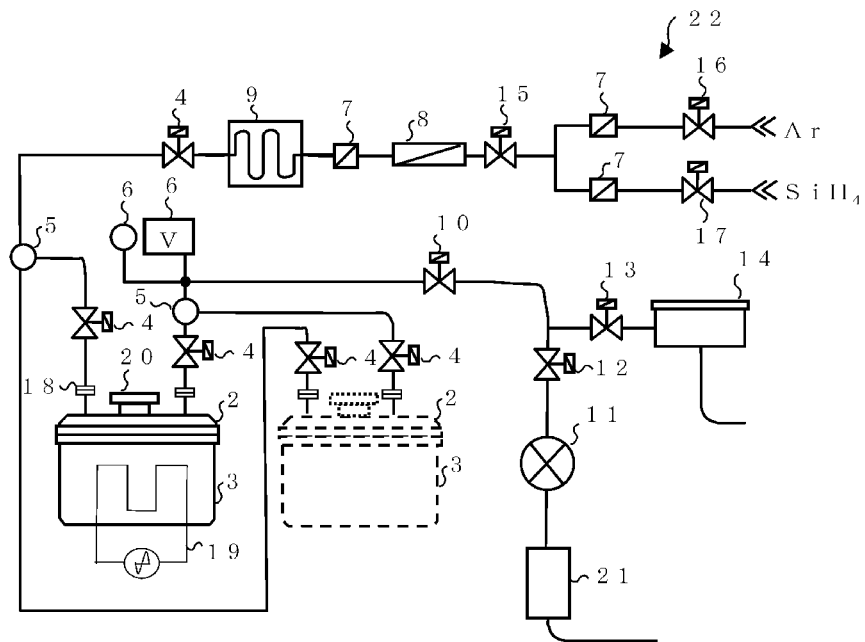
FIG. 2 is a schematic view of another embodiment of a system comprising the steps of heating a mold or crucible, drying in a vacuum, and transferring the mold or crucible, as well as supplying mono-silane gas and an external heating device according to the present invention.
Figure 3:
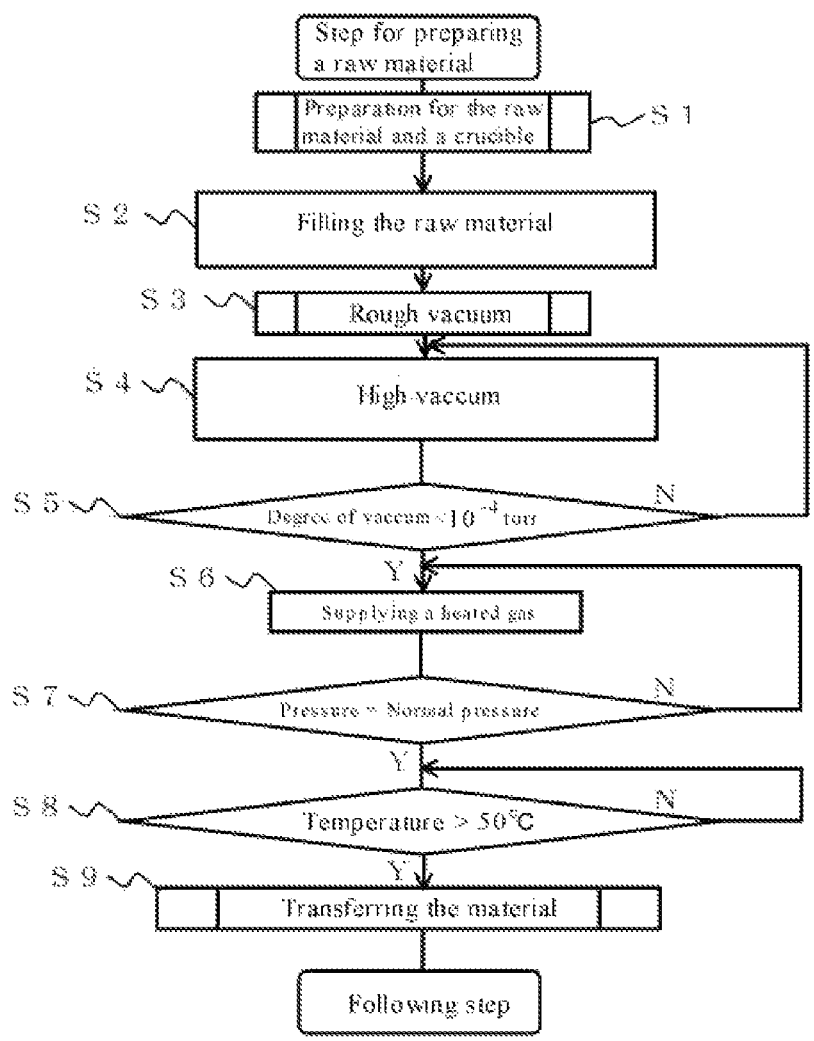
FIG. 3 is a flowchart of an embodiment showing an operation of a device transferring a raw material after storing it according to the present invention.

Embodiments of the present invention are described referring to FIGS. 1 to 3.

FIG. 1 is a schematic view of a system comprising a system comprising the steps of heating a mold or crucible, drying in vacuum, and transferring the mold or crucible. Referring to FIG. 1, in a storing system 1, a mold or crucible 3 is covered with a cap 2. Then, the inside of the mold or crucible 3 covered with the cap 2 is vacuumed via a vacuum distributor 5, a vacuum evacuation valve 10, and an evacuation valve 12 by a vacuum pump 11 after a valve 4 is opened.

At this time, in an area supplying argon gas, an argon gas-supplying valve 15 is closed whereas a gas regulator 7, a gas filter 8, a temperature rising heat exchanger 9, and a valve 4 connected thereto are opened. A pipe connected to the argon gas-supplying valve 15 in a gas supplying system is under vacuum. The pressure in the mold or crucible can be measured with a vacuum gauge 6. As the vacuum gauge 6, a pirani gauge or ionization vacuum gauge may be used depending on the degree of vacuum. When the degree of vacuum is sufficient, the evacuation valve 12 is closed and a vacuum valve 13 is opened. Then, a cryogenic pump 14 is operated.

After a high-vacuum state is achieved by using the cryogenic pump 14, the vacuum valve 13 is closed. And then, the argon gas-supplying valve 15 is opened and the temperature rising heat exchanger 9 is operated in order that the mold or crucible 3 is filled with heated argon gas. The vacuum evacuation valve 10 and the evacuation valve 12 are adjusted while the vacuum pump 11 is operated whereby a part of the heated gas that is reduced in temperature is evacuated as well as a new heated gas is provided in order to heat the raw material in the mold or crucible 3.

This series of operations may be automatically controlled by a programmable logic controller (PCL) or an embedded system. Specifically, when a number of molds or crucible 3 are connected in parallel and controlled, the automatic control is particularly effective.

In this case, the automatic control is useful since the temperature in the molds or crucibles may be automatically monitored with temperature sensors (not shown in figures) at the same time.

The temperature rising heat exchanger 9 may also be used for filling gas to the sintering furnace or the crystal growing furnace.

The raw material filled in the mold or crucible 3 is stored in a good dry state by the high-vacuum and the heated inert gas. Further, the transfer of the raw material to the furnace is performed by a handling robot or a simple carrier machine for a heavy material. The transfer is conducted by connecting a transferring arm-attachable part 20 attached to the cap 2 covering the mold or crucible 3 to a transferring mechanism.

If the gas supplying line and the vacuum evacuation line shown in FIG. 1 are freely movable, the raw material may be transferred with those lines kept connected to the mold or crucible 3. Since the raw material filled in the mold or crucible 3 is heated, the raw material surface may not have water adsorbed thereon even if the raw material is subjected to the air.

FIG. 2 is a schematic view of a system comprising the steps of heating the raw material, drying in a vacuum, and transferring the raw material, as well as supplying of mono-silane gas and an external heating device added thereto according to the present invention. Heating the raw material from the outside of the mold or crucible 3 by the external heating device may heat up in a short time the raw material in the mold or crucible 3 of a high heat capacity or the raw material filled in the mold or crucible 3.

At the upstream side thereof, the argon gas-supplying valve 15 is separated into a line to supply pure argon gas and a line to supply mono-silane gas ($SiH_4$). The flow rate of the mono-silane gas from the argon gas-supplying valve 15 is adjusted with the gas regulator 7, and a small amount of the mono-silane gas provided via a mono-silane gas valve 17 and the pure argon gas are mixed. Thus, via the argon gas-supplying valve 15, the gas filter 8, the gas regulator 7, the temperature rising heat exchanger 9, and the valve 4, a heated gas may be supplied to the mold or crucible 3.

In FIG. 2, a pipe removable unit 18 is attached to a gas-supplying pipe connected to the cap 2 and a vacuuming pipe connected to the cap 2. With the pipe removable unit 18, the mold or crucible 3 closed by the cap 2 may be separated from the pipes with the inside thereof kept at a vacuum state or gas-filled state. The structure of the pipe removable units 18 comprises a stop valve thereby keeping a reduced pressure or vacuum state.

The transferring arm-attachable part 20 attached to the cap 2 is removable from the handling robot or the simple carrier machine for a heavy material so that the mold or crucible 3 closed by the cap 2 is movable in connection with the carrying mechanism with the inside thereof kept at a vacuum state or gas-filled state.

In FIG. 2, an exhaust opening of the vacuum pump 11 for vacuum evacuation is provided with a gas-detoxifying device 21. The gas-detoxifying device 21 may enable mono-silane gas ($SiH_4$) to be handled safer, although only a small amount of the gas is used.

Although the argon gas is used as an inert gas in FIGS. 1 and 2, a helium gas may be used as the inert gas (not shown).

An inert gas-supplying system comprising the temperature rising heat exchanger 9 or a mono-silane gas ($SiH_4$) blend-supplying system may be shared in the following sintering step and the crystal growing step. Thus, it is unnecessary to have independent inert gas-supplying systems comprising the temperature rising heat exchanger 9 or independent mono-silane gas ($SiH_4$) blend-supplying systems in the vacuum drying and storing systems and in the sintering and crystal growing steps. Therefore, the total system is economical and simple.

FIG. 3 is a flowchart of an embodiment showing an operation of a device transferring a raw material after storing it according to the present invention.

There is a step of filling the raw material to the mold or crucible 3 in the mold or crucible preparation for manufacturing a sintered metal or a crystal for a semiconductor (step-1). The step-1 is operated in manufacturing the crystal for the semiconductor under a high-purity air circumstance because impurities may cause adverse effect. For instance, the step-1 is operated in a clean room or a clean booth. The clean booth is a hood for easily achieving a clean space and has a clean filer in the upper region thereof. High-purity air is supplied through the filter to the inside of the hood by an air blower. By using the clean room or the clean booth, the filled raw material may avoid dust.

In a raw material filling step (step-2), the raw material is filled in the mold or crucible 3. For manufacturing the sintered metal, the raw material is powder. Therefore, powder including a variety of metal powders mixed therein is put into the mold from a container to fill in the mold. On the other hand, for growing the crystal for the semiconductor, a material in massive form is filled in manually by a person wearing clean gloves without polluting the material.

After filling the material, the cap 2 is covered on the mold or crucible 3 filled with the raw material. Then, the mold or crucible 3 is sealed and roughly vacuumed (step-3).

The roughly-vacuuming is performed with a rotary vacuum pump or a rotary vacuum pump serially-connected with a booster pump for accelerating vacuum.

After the roughly-vacuuming, highly-vacuuming is performed (step-4).

The highly-vacuuming is performed with a cryopump or a diffusion pump with the mold or crucible 3 kept sealed with the cap 2, thereby achieving a high degree of vacuum in a short time.

With the mold or crucible 3 kept sealed with the cap 2, it is determined whether the degree of vacuum inside the mold or crucible 3 reaches $10^{-4}$ torr or less (step-5).

If the degree of vacuum is not $10^{-4}$ or less, the highly-vacuuming is continued (step-4)

When the degree of vacuum is $10^{-4}$ torr or less, a heated gas is supplied to the inside of the mold or crucible 3 with the mold or crucible 3 kept sealed with the cap 2 (step-6). In this case, the primary gate valve of the vacuum pump such as the cryopump or the diffusion pump is closed.

In this case, as shown in FIG. 2, an argon gas including a small amount of mono-silane gas ($SiH_4$) may be supplied. The argon gas may include the mono-silane gas in the range of about 0.01 to 3%.

With the mold or crucible 3 kept sealed with the cap 2, it is confirmed using a vacuum gauge whether the pressure inside the mold or crucible 3 reaches the normal pressure (step-7). The heated gas is supplied until the pressure reaches the normal (pressure=normal pressure). Further, with the mold or crucible 3 kept sealed with the cap, it is confirmed whether the temperature inside the mold or crucible 3 reaches 50 C. or more (temperature >50 C.) (step-8).

When the temperature in the mold or crucible 3 reaches 50 C. or more, a bracket of the handling robot or the simple carrier machine for a heavy material is attached to the transferring arm-attachable part 20 with the mold or crucible 3 kept sealed with the cap 2, and then the raw material is transferred (step-9).

When the transfer is completed, the sintering step or the semiconductor-crystal growing step is followed.

According to the present invention, if the mold or crucible 3 is opened after the raw material and the mold or crucible 3 are heated, the water adsorption from the air to the raw material is reduced. Thus, in the following sintering step or semiconductor-crystal growing step, a high quality sintered metal or semiconductor crystal is obtained.

The invention claimed is:

1. A method for storing a raw material inside a mold or a crucible, comprising the steps of:
   closing an opening of the mold filled with the raw material of a sintered metal or an opening of the crucible filled with the raw material for growth of a crystal for a semiconductor of a gallium arsenide crystal and a silicon single crystal or a polycrystalline silicon by a cap provided with a supply pipe and a vacuum evacuation pipe;
   vacuuming the inside of the mold or crucible to a high vacuum state of $10^{-4}$ torr or less via the vacuum evacuation pipe;
   drying by heating the raw material in the mold or crucible filled with a heated inert gas in the range of 50 C. to 200 C. via the supply pipe; and
   storing the raw material in the mold or the crucible covered with the cap.

2. The method for storing the raw material according to claim 1, wherein
   the vacuuming step comprises roughly vacuuming and then vacuuming to a high vacuum state of $10^{-4}$ torr or less using a cryopump, a diffusion pump or a molecular pump as a vacuum evacuation device for keeping a high vacuum state.

3. The method for storing the raw material according to claim 2, further comprising the steps of:
   evacuating the heated inert gas after the drying step until the pressure inside the mold or crucible returns to a high vacuum state of $10^{-4}$ torr or less; and
   refilling the heated inert gas in the mold or crucible.

4. The method for storing the raw material according to claim 2, further comprising the step of:
   transferring the mold closed with the cap in which the raw material is stored to a sintering place, or transferring the crucible closed with the cap in which the raw material is stored to a crystal growing place.

5. The method for storing the raw material according to claim 2, further comprising the step of:
   heating the raw material from outside of the mold or crucible covered with the cap to keep the raw material heated.

6. The method for storing the raw material according to claim 2, wherein
   the heated inert gas comprises a mono-silane gas.

7. A storing device for storing a raw material, comprising:
   a mold or a crucible; and
   a cap;
   wherein an opening of the mold filled with the raw material of a sintered metal or an opening of the crucible filled with the raw material for growth of a crystal for a semiconductor of a gallium arsenide crystal and a silicon single crystal or a polycrystalline silicon is covered by the cap provided with a supply pipe and a vacuum evacuation pipe; and
   wherein the inside of the mold or crucible is vacuumed and filled with a heated inert gas in the range of 50 C. to 200 C. via the supply pipe such that the raw material is heated and dried.

8. The storing device for storing a raw material according to claim 7, further comprising:
   a transfer device for transferring the mold covered with the cap in which the raw material is stored to a sintering place, or transferring the crucible covered with the cap in which the raw material is stored to a place to grow a crystal.

9. The method for storing the raw material according to claim 1, further comprising the steps of:
   evacuating the heated inert gas after the drying step until the pressure inside the mold or crucible returns to a high vacuum state of $10^{-4}$ ton or less ; and
   refilling the heated inert gas in the mold or crucible.

10. The method for storing the raw material according to claim 1, further comprising the step of:
    transferring the mold closed with the cap in which the raw material is stored to a sintering place, or transferring the crucible closed with the cap in which the raw material is stored to a crystal growing place.

11. The method for storing the raw material according to claim 1, further comprising the step of:
    heating the raw material from outside of the mold or crucible covered with the cap to keep the raw material heated.

12. The method for storing the raw material according to claim 1, wherein
    the heated inert gas comprises a mono-silane gas.

\* \* \* \* \*